United States Patent

Saigo

Patent Number: 6,044,331
Date of Patent: *Mar. 28, 2000

[54] BATTERY CAPACITY MEASURING SYSTEM EMPLOYING A VOLTAGE-TO-CURRENT APPROXIMATED STRAIGHT LINE

[75] Inventor: Tsutomu Saigo, Shizuoka-ken, Japan

[73] Assignee: Yazaki Corporation, Tokyo, Japan

[*] Notice: This patent is subject to a terminal disclaimer.

[21] Appl. No.: 08/865,101

[22] Filed: May 29, 1997

[30] Foreign Application Priority Data

May 31, 1996 [JP] Japan ................................. 8-138365

[51] Int. Cl.⁷ .................................................. G01R 19/00
[52] U.S. Cl. .............................................................. 702/63
[58] Field of Search ........................ 702/63, 57; 324/426, 324/427; 320/127, 149

[56] References Cited

U.S. PATENT DOCUMENTS

| | | | |
|---|---|---|---|
| 5,617,324 | 4/1997 | Arai | 702/63 |
| 5,672,973 | 9/1997 | Arai et al. | 324/427 |
| 5,698,983 | 12/1997 | Arai et al. | 702/63 |
| 5,703,486 | 12/1997 | Arai et al. | 324/427 |
| 5,744,931 | 4/1998 | Arai et al. | 320/149 |
| 5,789,923 | 8/1998 | Shimoyama et al. | 324/427 |
| 5,793,211 | 4/1998 | Shimoyama | 324/427 |
| 5,798,934 | 8/1998 | Saigo et al. | 702/63 |

Primary Examiner—Eric W. Stamber
Assistant Examiner—Matthew Smithers
Attorney, Agent, or Firm—Finnegan, Henderson, Farabow, Garrett & Dunner, LLP

[57] ABSTRACT

A detection value inputting circuit samples a voltage across a battery connected to a load and the current flowing through the load. A correlation decision section obtains a voltage-to-current correlation coefficient between the plurality of voltage data and the plurality of current data. A nonvolatile memory stores as capacity data the inclination and intercept of a voltage-to-current approximate straight line and the battery remaining capacity attained on the basis of the approximate straight line. A data employing range determining section reads out the capacity data from the nonvolatile memory when the correlation coefficient exceeds a given value, determines a data employing range on the basis of the capacity data and further deletes the voltage data and the corresponding current data which do not exist within the data employing range. An approximate straight line calculating section calculates a voltage-to-current approximate straight line on the basis of the plurality of voltage data and current data left after the deletion of the data not existing within the data employing range. A battery remaining capacity calculating section substitutes a predetermined reference current into the approximate straight line to obtain a voltage corresponding thereto and obtains a battery remaining capacity corresponding to this voltage. The data employing range determining section stores the data on the inclination and intercept of the approximate straight line and the data on the corresponding battery remaining capacity as a set in the nonvolatile memory.

5 Claims, 7 Drawing Sheets

FIG. 2

| REMAINING CAPACITY $P_{Pi}$(%) | INCLINATION $A_{Pi}$ | INTERCEPT $B_{Pi}$ |
|---|---|---|
| 100 | 30 | 800 |
| 99 | 30 | 790 |
| 98 | 30 | 780 |
| ⋮ | ⋮ | ⋮ |
| 1 | 8 | 200 |
| 0 | 6 | 180 |

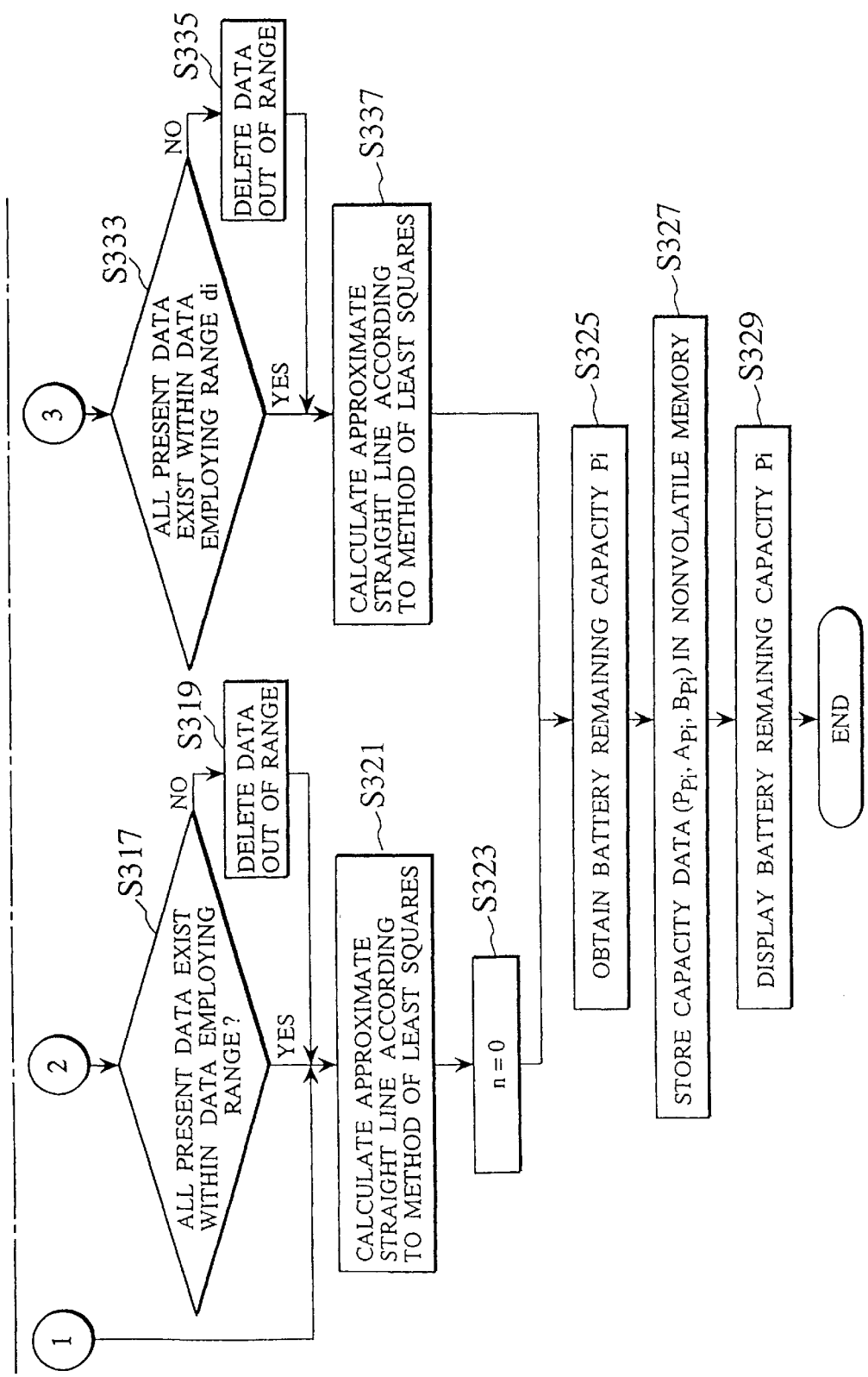

BATTERY CAPACITY MEASURING SYSTEM EMPLOYING A VOLTAGE-TO-CURRENT APPROXIMATED STRAIGHT LINE

BACKGROUND OF THE INVENTION

1. Field of the Invention

The present invention relates to a battery capacity measuring system, and more particularly to a battery capacity measuring system which removes a singular point of data by demarcating a range of data to be employed on the basis of the data representative of the battery capacity at the previous running.

2. Description of the Related Art

In a prior battery capacity measuring system, the measurement of the battery capacity depends upon the obtained coefficient of correlation between a plurality of voltage values and a plurality of current values corresponding thereto, and when this correlation coefficient assumes a large negative correlation (for example, below −0.9), an approximate straight line is attained by processing these voltage values and current values through the use of the method of least squares.

In addition, the voltage at the intersection (node) between the approximate straight line and a predetermined reference (criterion) value is converted into a remaining capacity and put to display.

However, in cases where such a battery capacity measuring system is incorporated into an electric motor vehicle or the like, the electric motor vehicle generates a lot of noise, with the result that, when collecting a plurality of voltage values and a plurality of current values, as shown in FIG. 5 some data can reside at a place(s) (which will be referred to hereinafter as a singular point) abnormally remote from places where many data gather.

If obtaining an approximate straight line on the basis of the coefficient of correlation (for example, −0.96) irrespective of the presence of such a singular point, the resultant approximate straight line lies as indicated by a dotted line b in FIG. 6. On the other hand, when attaining an approximate straight line as function of the coefficient of correlation (for instance, −0.99) in the absence of the singular point, the resultant approximate straight line is indicated by a solid line a in FIG. 6.

More specifically, as shown in FIG. 6 the inclination of the approximate straight line varies in accordance with whether the singular point exists or not. This signifies that the obtained approximate straight line involves an error in the presence of the singular point.

The prior battery capacity measuring system is designed to calculate the approximate straight line if the coefficient of correlation between pluralities of voltage values and current values collected merely comes to below −0.9, and therefore, in many cases the resultant approximate straight line involves the singular point.

One possible solution of the problem in the approximate straight line involving singular points may be that the coefficient of correlation serving as the decision condition is set to approximately −0.99. However, since the past data is additionally adopted for the approximate straight line, the coefficient of correlation can assume approximately −0.99 even if including the singular point, with the result that an error arises in the course of repeatedly attaining the approximate straight lines.

SUMMARY OF THE INVENTION

Accordingly, the present invention has been developed with a view to eliminating the above-mentioned problem, and it is an object of this invention to provide a battery capacity measuring system which is capable of finding a remaining capacity voltage with a high accuracy by attaining the voltage-to-current approximate straight line on the basis of data not including at least the data at the singular point.

For this purpose, in accordance with the present invention, there is provided a battery capacity measuring system comprising: voltage/current detecting means for use in sampling a voltage across a battery connected to a load and a current flowing through the load; correlation decision means for use in obtaining a voltage-to-current correlation coefficient between a plurality of voltage data and a plurality of current data corresponding thereto, given by the voltage/current detecting means; a nonvolatile memory for storing capacity data as an inclination and intercept of an approximate straight line based upon the plurality of voltage data and the plurality of current data and a battery capacity obtained on the basis of the approximate straight line; data employing range determining means for, when the correlation decision means makes a decision that a correlation exceeds a given value, reading out capacity data corresponding to the plurality of voltage data and the plurality of current data from the nonvolatile memory to determine a data employing range on the basis of the capacity data and further for deleting the voltage data and the current data corresponding thereto which do not exist within the data employing range; approximate straight line calculating means for use in obtaining a voltage-to-current approximate straight line on the basis of the plurality of voltage data and the plurality of current data left after the deletion of the voltage data and corresponding current data by the data employing range determining means; and battery capacity calculating means for use in substituting a preset reference current into the approximate straight line to obtain a voltage corresponding thereto and further for calculating a battery capacity corresponding to the voltage, wherein the data employing range determining means stores a set of data about an inclination and intercept of the approximate straight line obtained by the approximate straight line calculating means and data about the corresponding battery capacity calculated by the remaining capacity calculating means.

In accordance with this invention, the singular point data is eliminated on the basis of the capacity data at the last running, thus finding a battery capacity with a high accuracy and reliability.

According to a preferred embodiment of this invention, the initial running the data employing range determining means determines, as the data employing range an area around the approximate straight line based upon the plurality of voltage data and the plurality of current data which have a correlation above a given value as a result of the decision of the correlation decision means.

Furthermore, according to a preferred embodiment of this invention, the data employing range determining means does not determine the data employing range when, at the initial running, the plurality of voltage data and the plurality of current data, having a correlation above a given value as a result of the decision of the correlation decision means, are the data given from the voltage/current detecting means prior to a given time.

Still further, according to a preferred embodiment of this invention, the approximate straight line calculating means calculates the approximate straight line by the method of least squares.

Moreover, according to a preferred embodiment of this invention, the battery capacity measuring system further comprises display means for displaying the remaining battery capacity that the battery capacity calculating means calculates.

BRIEF DESCRIPTION OF THE DRAWINGS

The object and features of the present invention will become more readily apparent from the following detailed description of the preferred embodiments taken in conjunction with the accompanying drawings in which:

FIG. 2 is an illustration available for use in describing capacity data in a nonvolatile memory;

FIGS. 3A and 3B are flow charts useful for description of an operation in this invention;

DESCRIPTION OF THE PREFERRED EMBODIMENTS

Figure 1:
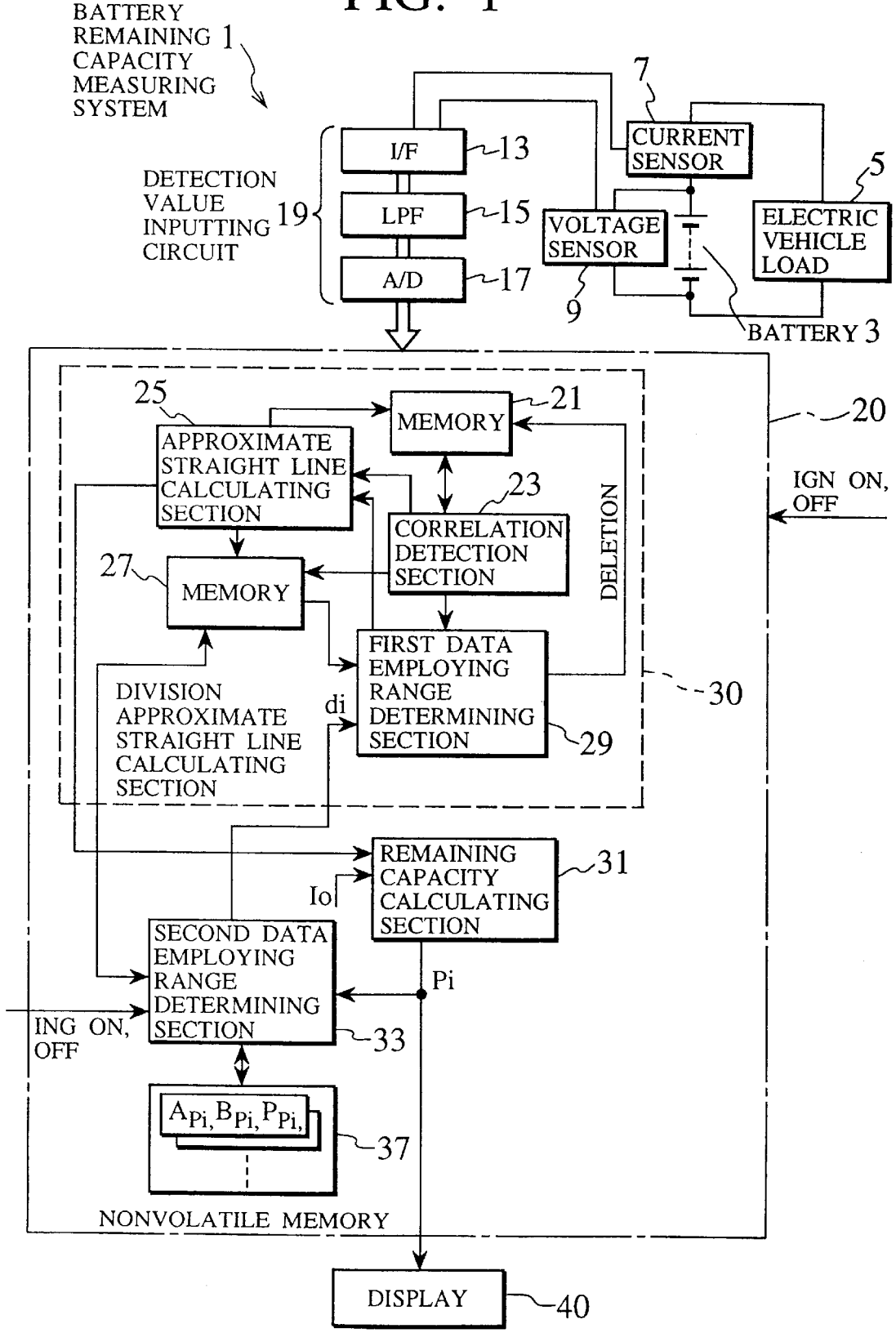
FIG. 1 is a schematic illustration of an arrangement of a battery capacity measuring system according to an embodiment of the present invention.

FIG. 1 schematically shows an arrangement of a battery capacity measuring system according to an embodiment of the present invention. As shown in FIG. 1, a battery capacity measuring system, generally designated at numeral 1, comprises an electric motor vehicle load 5 in connection with a battery 3, a current sensor 7 to detecting a current flowing through the electric motor vehicle load 5 (referred to hereinafter to as a load 5), and a voltage sensor 9 functioning to sense a terminal voltage of the battery 3.

In addition, the battery capacity measuring system 1 includes a detection value input circuit section 19 comprising an I/F 13, an LPF 15 and an A/D 17 for use in receiving a voltage value and current value of the battery 3 from the voltage sensor 9 and the current sensor 7 at every given time, for use in converting the values into a digital form after removal of noises and further for storing these data in a memory 21.

Also included therein is an arithmetic section 20 which comprises a division approximate straight line calculating section 30 comprising a correlation decision section 23, an approximate straight line calculating section 25, a first data employing range determining section 29, the aforesaid memory 21 and a memory 27, and further comprising a remaining capacity calculating section 31, a second data employing range determining section 33 and a nonvolatile memory 37.

The correlation decision section 23 averages the plurality of voltage values and the plurality of corresponding current values stored in the memory 21 at a given time interval and collects the plurality of averaged data. Further, the correlation decision section 23 obtains a voltage-to-current correlation coefficient r with the plurality of data, i.e., in terms of a plurality of averaged voltage value data and a plurality of averaged current value data corresponding thereto (a set of average data) and further decides whether the resultant coefficient of correlation r is below −0.9.

When the coefficient of correlation r comes to below −0.9, the correlation decision section 23 communicates to the first data employing range determining section 29 the inclination, coordinate values and other data of the previous approximate straight line (which is the approximate straight line attained on the basis of the data with the latest coefficient of correlation below −0.9) already stored in memory 27.

Whenever the coefficient of correlation below −0.9 is obtained, the first data employing range determining section 29 determines, as the data employing range, the area in the vicinity of or around the approximate straight line on the basis of the inclination, coordinate values and other data of the previous approximate straight line fed from the correlation decision section 23. Further, the first data employing range determining section 29 removes, of the present data, the data out of this data employing range from the memory 21 and then starts the approximate straight line calculating section 25.

The approximate straight line calculating section 25 takes in the plurality of voltage value data and the plurality of corresponding current value data not including the data at the so-called singular point and assumes the voltage-to-current approximate straight line to be $(I=A_i \cdot V+B_i)$. In addition, the approximate straight line calculating section 25 calculates the total sum of squares of the differences between these data and the assumed. approximate straight line and finds $A_i$, $B_i$ minimizing these differences to determine the voltage-to-current approximate straight line $(I=A_i \cdot V+B_i)$ on the basis of the calculated $A_i$, $B_i$.

The remaining capacity calculating section 31 substitutes a predetermined current value into the approximate straight line equation $(I=A_i \cdot V+B_i)$ at every calculation of the approximate straight line to specify a voltage value on the voltage-current axes and displays the corresponding remaining capacity (%) on the basis of the specified voltage value.

The second data employing range determining section 33, at every acquirement of the remaining capacity $P_i$, makes the correspondence between the inclination $A_i$ and the intercept $B_i$ and successively stores them in the nonvolatile memory 37 in pairs.

Furthermore, upon calculation of the remaining capacity $P_i$, the second data employing range determining section 33 reads the remaining capacity $P_{pi}$ at the previous running corresponding to this remaining capacity $P_i$ when there is the capacity data stored in the nonvolatile memory 37, (in the case of no initial running) and determines a new data employing range $d_n$ on the memory 27 on the basis of $A_{pi}$ and $B_{pi}$ corresponding to the read $P_{pi}$ to set the determined $d_n$ in the first data employing range determining section 29.

Still further, as shown in FIG. 2, the nonvolatile memory 37 stores the remaining capacity $P_{pi}$ of the previous running and the inclination $A_{pi}$ of the approximate straight line at that time and the intercept $B_{pi}$ in the corresponding relationship. These values $P_{pi}$, $A_{pi}$, and $B_{pi}$ will generally be referred to as capacity data.

Figure 3A:
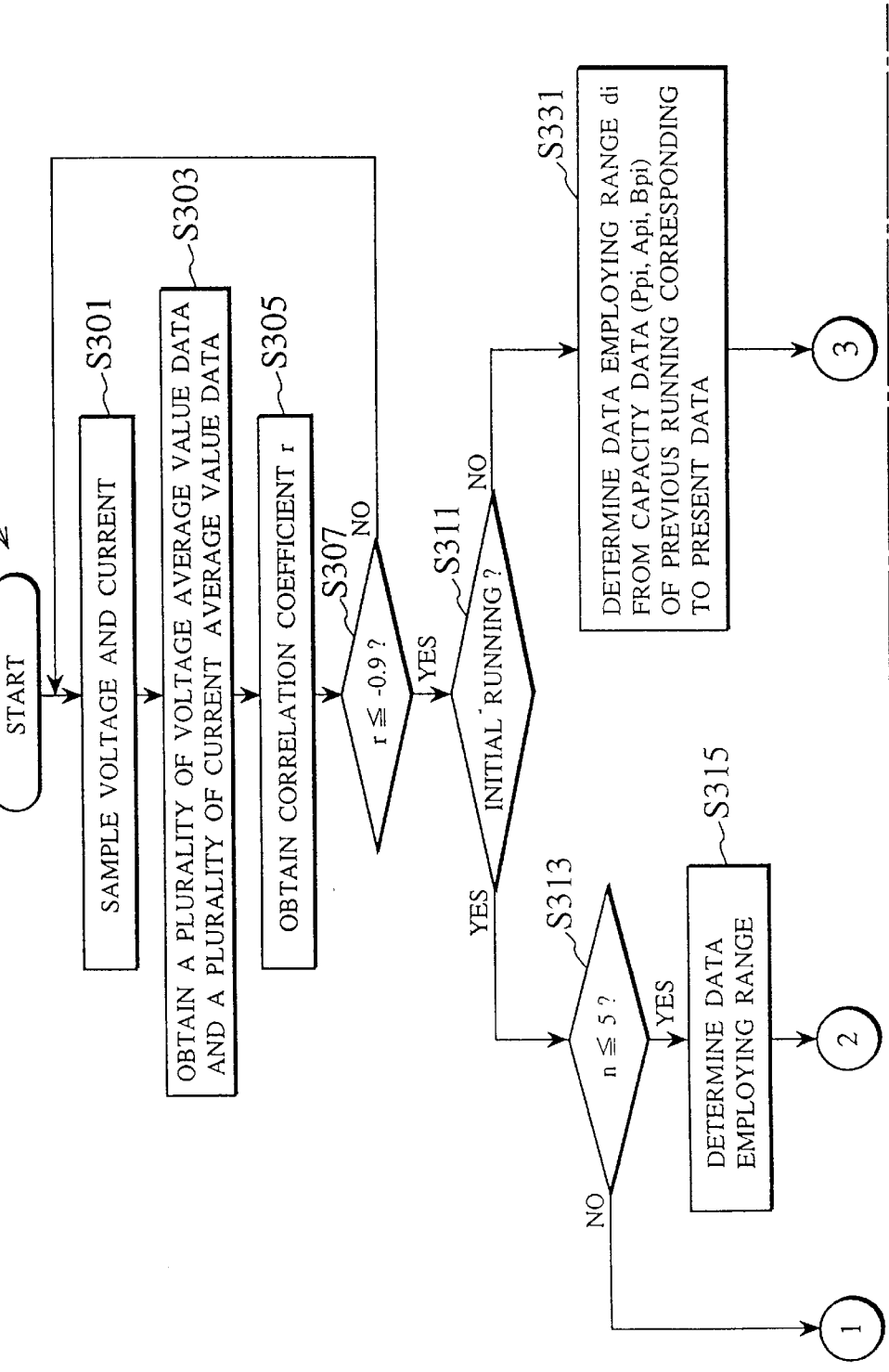

A description will be made hereinbelow of an operation of the battery capacity measuring system thus arranged. FIGS. 3A and 3B are flow charts useful for describing the operation of the battery capacity measuring system.

Upon the turning-on the ignition, the detection value inputting circuit 19 starts to sample the voltage value of the battery 3 detected by the voltage sensor 9 and the current value flowing through the load 5 detected by the current sensor 7 (step S301), with the sampling being made, for example, at an interval of 1 ms.

The correlation coefficient decision section 23 averages a plurality of voltage value data and a plurality of current value data corresponding thereto for a give period of time, for example, for 100 ms. In addition, the correlation coefficient decision section 23 conducts this processing for a given period of time, for example, for 10 seconds, to attain a plurality of voltage average value data and a plurality of corresponding current average value data, for example, at 100 pairs (step S303).

Subsequently, the correlation coefficient decision section 23 calculates the voltage-to-current correlation coefficient r between the obtained plurality of voltage average value data and the obtained plurality of current average value data (step S305) and further decides whether or not the calculated coefficient of correlation r is below −0.9 (step S307).

If the decision of the step S307 is that the coefficient of correlation r is above −0.9, a counter n (referred to hereinafter as a correlation result counter) for counting the number of times that the coefficient of correlation r exceeds −0.9, is incremented (step S309), and subsequently the operational flow returns to the step S301.

On the other hand, if the decision is that the coefficient of correlation r is below −0.9, the second data employing range determining section 33 checks whether it is the initial running or not (step S311), that is, decides whether or not there is already data stored in the nonvolatile memory 37.

If the decision is made that it is the initial running, the initial data is obtained as follows. Decision is first made as to whether or not the correlation result counter n is below a given value, for example, below 5 (step S313).

Figure 4:
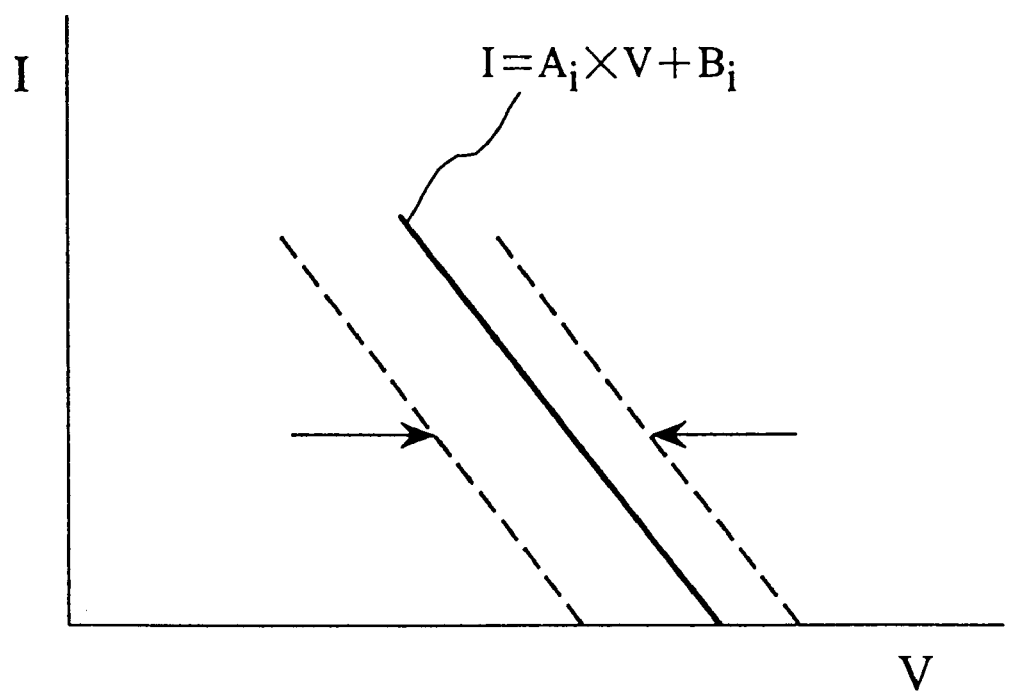
FIG. 4 is an illustration useful for explanation of a data employing range in this invention.
Figure 5:
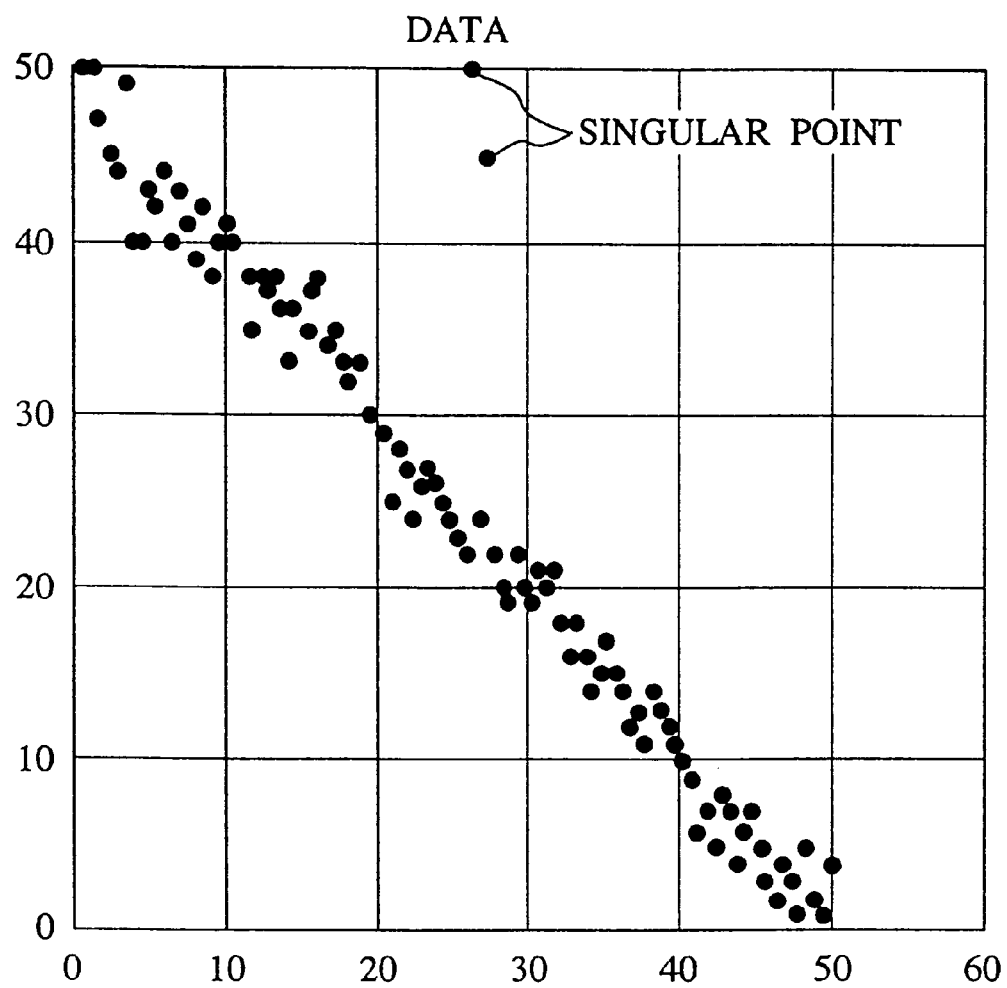
FIG. 5 is an illustration of plotting pluralities of collected voltage value data and current value data on coordinates.
Figure 6:
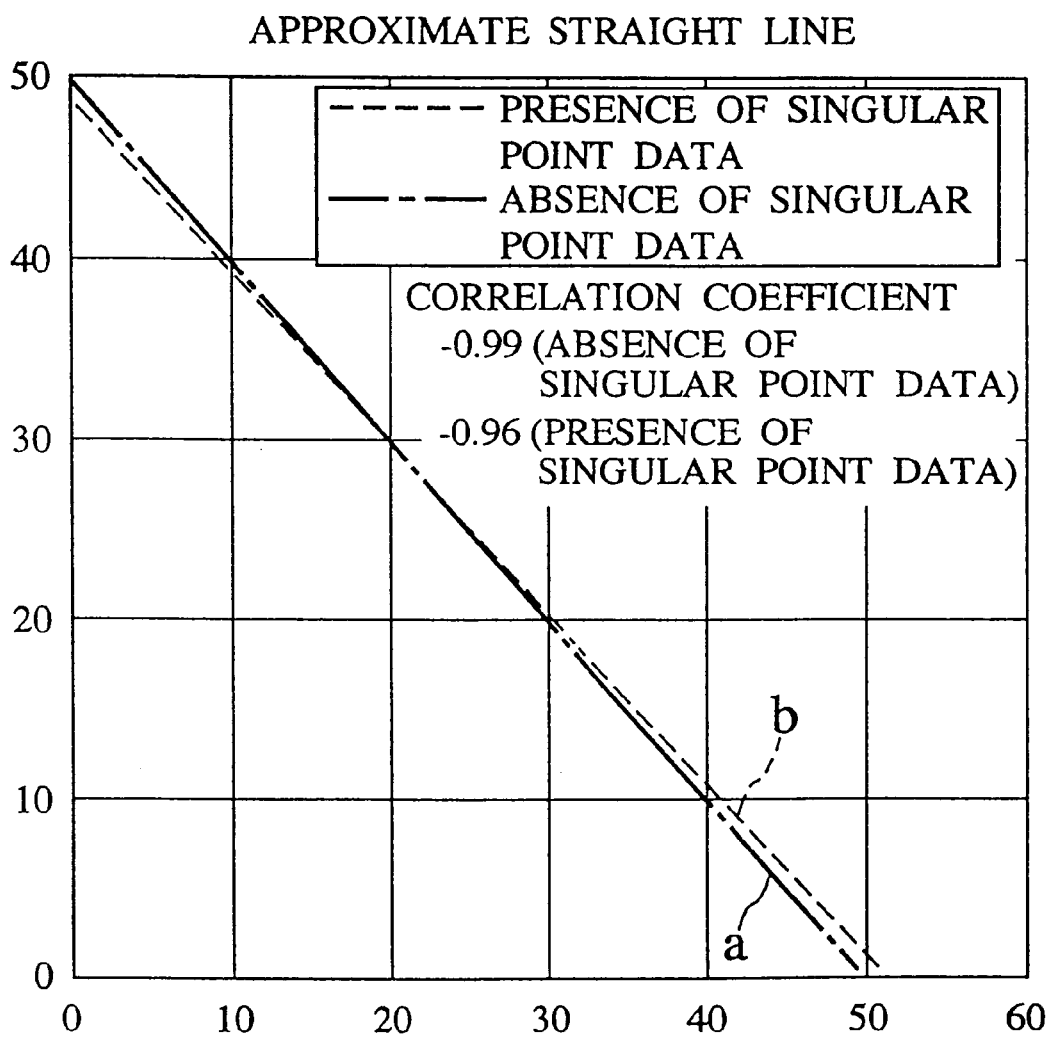
FIG. 6 is an illustration of approximate straight lines resulting from the presence and absence of a singular point.

If the value of the correlation result counter n does not reach the given value, the first data employing range determining section 29 defines the data employing range in the vicinity of the approximate straight line ($I=A_{i-n-1} \cdot V+B_{i-n-1}$) (referred to hereinafter as a previous approximate straight line) coming from the data stored in the memory 27 and obtained last time in a state where the coefficient of correlation r was below −0.9 (step S315). For example, let it be assumed that the numbers of times of collection i−3, i−2 and i−1 develop the coefficients of correlation (−0.92), (−0.85) and (−0.5), respectively. In this instance, since the approximate straight line is obtained at −0.92, this approximate straight line is treated as the previous approximate straight line. Following this, decision is made as to whether or not the present data are all in that data employing range (step S317). For example, when the previous approximate straight line ($I=A_{i-n-1} \cdot V+B_{i-n-1}$) resides on the coordinate axes as shown in FIG. 4 (it is also possible that the vertical axis shows the voltage while the horizontal axis denotes the current), the data employing range is determined to be the area between the dotted lines. In the case that all the present data do not fall within the data employing range, the data (singular point data) out of that range undergoes deletion. After this, the operational flow goes to a step S321. On the other hand, in the case that all the present data are within that data employing range, the operational flow directly proceeds to the step S321.

In cases where in the step S313, the value of the correlation result counter n is not below the given value, when the present data is remote in time from the previous data, the operational flow directly goes to the step S321 without demarcating the range based upon the previous data.

In the step S321, the approximate straight line calculating section 25 obtains the approximate straight line ($I=A_i \cdot V+B_i$) according to the method of least squares on the basis of the plurality of present voltage average value data and the plurality of the present current average value data, and further initializes the correlation result counter n (step S323).

The remaining capacity calculating section 31 substitutes a predetermined reference current $I_o$ into the approximate straight line equation attained by the approximate straight line calculating section 25 to get a corresponding voltage and further obtains a battery remaining capacity $P_i$ corresponding to that voltage (step S325).

The second data employing range determining section 33 combines the present remaining capacity $P_i$ and the inclination $A_{pi}$ of the approximate straight line at this time and the intercept $B_{pi}$ and stores the combination as capacity data ($P_{pi}$, $A_{pi}$, $B_{pi}$) in the nonvolatile memory 37 (S327). Further, the remaining capacity calculating section 31 sends data on the remaining capacity $P_i$ to a display section 40 which in turn, updates the display of the remaining capacity (S329).

On the other hand, if the answer to the step S311 shows no initial running, the second data employing range determining section 33 reads, from the nonvolatile memory 37 the capacity data ($P_{pi}$, $A_{pi}$, $B_{pi}$) of the previous running corresponding to the plurality of present voltage average value data and the plurality of present current average value data and sets the data employing range $d_i$ in the vicinity of the regression straight line ($I=A_{pi} \cdot V+B_{pi}$) of the previous running obtained on the basis of that inclination $A_{pi}$ and intercept $B_{pi}$ (step S331). The second data employing range determining section 33 sends this data employing range $d_i$ to the first data employing range determining section 29.

The first data employing range determining section 29 decides whether or not the present data are all within the data employing range $d_i$ (step S333). If all the present data are not within data employing range $d_i$, the first data employing range determining section 29 deletes the data (the singular point data) out of the range (step S335), and the operational flow advances to a step S337. On the other hand, if all the preset data are within data employing range $d_i$, the operational flow goes directly to step S337.

In the step S337, the approximate straight line calculating section 25 obtains an approximate straight line ($I=A_i \cdot V+B_i$) according to the method of least squares in terms of the plurality of present voltage average value data and the plurality of present current average value data.

Furthermore, even at no initial running, the remaining capacity calculating section 31 calculates the battery remaining capacity $P_i$ (step S325). However, since the capacity data is already stored in the nonvolatile memory 37 at no initial running, the second data employing range determining section 33 updates the capacity data ($P_{pi}$, $A_{pi}$, $B_{pi}$) within the nonvolatile memory 37 (S327). Further, the remaining capacity calculating section 31 delivers the data of the remaining capacity $P_i$ to the display section 40 which in turn, renews the display of the remaining capacity (S329).

As described above, according to this invention, in the case of the initial running, for the removal of the singular point data a range in the vicinity of the approximate straight line obtained from the previous data of the coefficient of correlation being below −0.9 is employed as an effective data range. In addition, a capacity data is newly put in the memory at the initial running.

On the other hand, in the case of no initial running, the capacity data is already put in the memory and hence a range in the vicinity the approximate straight line based upon the corresponding capacity data is taken as an effective data range. Further, the previous data is replaced with the capacity data based upon the data not including the singular point data.

That is, according to this invention, the capacity data is renewed at every running to eliminate the singular point data with a more accurate data employing range, and therefore a battery capacity is obtainable with a high accuracy and reliability.

Although in the above-described embodiment this invention is explained as being used as a battery capacity measuring system for an electric motor vehicle, it is also available for systems where the discharge current varies excessively or the variation occurs regularly.

Furthermore, although the above-described embodiment uses the nonvolatile memory, if the contents of the RAM is maintained in such a manner that the computer is brought into sleep mode after turning-off the ignition, there is no need to use the nonvolatile memory.

Still further, the data employing range can also be set taking the kind and the number of the battery into consideration.

It should be understood that the foregoing relates only to a preferred embodiment of the present invention, and that it is intended to cover all changes and modifications of the embodiment of the invention herein used for the purposes of the disclosure, which do not constitute departures from the spirit and scope of the invention.

What is claimed is:

1. A battery capacity measuring system comprising:

voltage/current detecting means for use in sampling a voltage across a battery connected to a load and a current flowing through said load;

correlation decision means for use in obtaining a degree of correlation between a plurality of voltage data and a plurality of current data corresponding thereto, given by said voltage/current detecting means;

a nonvolatile memory for use in storing capacity data as an inclination and intercept of an approximate straight line based upon said plurality of voltage data and said plurality of current data, and a remaining battery capacity obtained on the basis of said approximate straight line;

data employing range determining means for use in, when said correlation decision means makes a decision that the degree of correlation is at least a given value, reading out capacity data corresponding to said plurality of voltage data and said plurality of current data from said nonvolatile memory to determine a data employing range on the basis of said capacity data and further for deleting the voltage data and the current data corresponding thereto which do not exist within said data employing range;

approximate straight line calculating means for use in obtaining a voltage-to-current approximate straight line on the basis of said plurality of voltage data and said plurality of current data left after the deletion of the voltage data and corresponding current data existing outside said data employing range by said data employing range determining means; and battery capacity calculating means for use in substituting a preset reference current into the obtained approximate straight line to obtain a voltage corresponding thereto and further for calculating a remaining battery capacity corresponding to the obtained voltage, wherein said data employing range determining means stores a set of data about an inclination and intercept of said approximate straight line that was obtained by said approximate straight line calculating means and data about the corresponding remaining battery capacity calculated by said remaining capacity calculating means.

2. A battery capacity measuring system as defined in claim 1, wherein at an initial running said data employing range determining means determines as said data employing range an area around an approximate straight line, based upon said plurality of voltage data and said plurality of current data most recently detected by said voltage/current detecting means and which has a degree of correlation therebetween that is not less than the value obtained by said correlation decision means.

3. A battery capacity measuring system as defined in claim 2, wherein at the initial running said data employing range determining means does not determine said data employing range when said plurality of voltage data and said plurality of current data, most recently detected by said voltage/current detecting means, have a degree of correlation therebetween that is not less than the value obtained by said correlation decision means for data sampled a predetermined of time before said voltage/current detecting means detected the most recently detected plurality of voltage data and plurality of current data.

4. A battery capacity measuring system as defined in claim 1, wherein said approximate straight line calculating means calculates said approximate straight line through the use of a method of least squares.

5. A battery capacity measuring system as defined in claim 1, further comprising display means for displaying said battery capacity calculated by said remaining battery capacity calculating means.

* * * * *

UNITED STATES PATENT AND TRADEMARK OFFICE
CERTIFICATE OF CORRECTION

PATENT NO. : 6,044,331
DATED : March 28, 2000
INVENTOR(S) : Saigo

Page 1 of 1

It is certified that error appears in the above-identified patent and that said Letters Patent is hereby corrected as shown below:

Title page,
Line 2, "LLP" should read -- L.L.P. --.

Column 8,
Line 45, after "displaying said", insert -- remaining --.
Line 46, before "battery" (second occurrence), delete "remaining".

Signed and Sealed this

Twenty-first Day of August, 2001

*Attest:*

*Attesting Officer*

NICHOLAS P. GODICI
*Acting Director of the United States Patent and Trademark Office*